United States Patent
Wang et al.

(10) Patent No.: US 10,825,857 B2
(45) Date of Patent: Nov. 3, 2020

(54) PIXEL FOR UNCOOLED INFRARED FOCAL PLANE DETECTOR AND PREPARATION METHOD THEREFOR

(71) Applicant: YANTAI RAYTRON TECHNOLOGY CO., LTD, Shandong (CN)

(72) Inventors: Hongchen Wang, Shandong (CN); Peng Wang, Shandong (CN); Wenli Chen, Shandong (CN); Dong Qiu, Shandong (CN)

(73) Assignee: Yantai Raytron Technology Co., Ltd, Shandong (CN)

( * ) Notice: Subject to any disclaimer, the term of this patent is extended or adjusted under 35 U.S.C. 154(b) by 33 days.

(21) Appl. No.: 16/337,868

(22) PCT Filed: Sep. 29, 2016

(86) PCT No.: PCT/CN2016/100865
§ 371 (c)(1),
(2) Date: Mar. 28, 2019

(87) PCT Pub. No.: WO2018/058450
PCT Pub. Date: Apr. 5, 2018

(65) Prior Publication Data
US 2020/0027916 A1    Jan. 23, 2020

(51) Int. Cl.
| | | |
|---|---|---|
| H01L 27/14 | (2006.01) | |
| H01L 27/146 | (2006.01) | |
| G01J 5/10 | (2006.01) | |

(52) U.S. Cl.
CPC ......... *H01L 27/14689* (2013.01); *G01J 5/10* (2013.01); *H01L 27/14629* (2013.01); *H01L 27/14636* (2013.01); *H01L 27/14649* (2013.01)

(58) Field of Classification Search
CPC ......... H01L 27/14689; H01L 27/14649; H01L 27/14636; H01L 27/146; G01J 5/10
See application file for complete search history.

(56) References Cited

U.S. PATENT DOCUMENTS

| | | | | |
|---|---|---|---|---|
| 5,821,598 A | * | 10/1998 | Butler | G01J 5/20 257/467 |
| 6,635,495 B2 | * | 10/2003 | Hashimoto | G01J 5/34 250/338.2 |

(Continued)

FOREIGN PATENT DOCUMENTS

| | | |
|---|---|---|
| CN | 102951597 A | 3/2013 |
| CN | 103112817 A | 5/2013 |

(Continued)

OTHER PUBLICATIONS

Extended European Search Report regarding Application No. 16917204.6 dated Apr. 9, 2020.

(Continued)

*Primary Examiner* — Kiho Kim
(74) *Attorney, Agent, or Firm* — Harness, Dickey & Pierce, P.L.C.

(57) ABSTRACT

Provided are a pixel of an uncooled infrared focal plane detector and a preparation method therefor. The pixel includes a structure of three layers sequentially located on a semiconductor substrate from bottom to top. The first layer is a bridge structure including a metal reflection layer, an insulation dielectric layer, a first supporting layer, a first support layer protection layer, a first metal electrode layer and a first silicon nitride dielectric layer. The second layer is a thermal conversion structure including a second support layer, a second support layer protection layer, a thermal sensitive layer, a thermal sensitive layer production layer, a second metal electrode layer and a second silicon nitride dielectric layer. The third layer is an absorption structure (Continued)

including a third support layer, an absorption layer and an absorption layer protection layer.

17 Claims, 6 Drawing Sheets

(56) References Cited

U.S. PATENT DOCUMENTS

| | | | |
|---|---|---|---|
| 6,690,014 B1 | 2/2004 | Gooch et al. | |
| 6,891,161 B2 | 5/2005 | Ionescu et al. | |
| 6,924,485 B2 | 8/2005 | Kanzaki | |
| 9,646,874 B1* | 5/2017 | Wojciechowski | H01L 21/764 |
| 2002/0139784 A1 | 10/2002 | Tsuchiya et al. | |
| 2002/0175284 A1* | 11/2002 | Vilain | B81B 7/0038 |
| | | | 250/338.1 |
| 2002/0179837 A1* | 12/2002 | Ray | G01J 5/20 |
| | | | 250/338.1 |
| 2004/0217264 A1* | 11/2004 | Wood | H01L 31/02024 |
| | | | 250/214 R |
| 2005/0094240 A1* | 5/2005 | Huibers | G02B 26/0841 |
| | | | 359/290 |
| 2006/0050353 A1* | 3/2006 | Huibers | G02B 26/0841 |
| | | | 359/238 |
| 2008/0237467 A1 | 10/2008 | Oda et al. | |
| 2009/0231673 A1* | 9/2009 | Oden | G02B 26/0841 |
| | | | 359/291 |
| 2010/0148067 A1* | 6/2010 | Cheon | G01J 5/02 |
| | | | 250/338.1 |
| 2011/0108729 A1* | 5/2011 | Oda | H01L 27/14649 |
| | | | 250/338.4 |
| 2011/0266445 A1 | 11/2011 | Beratan | |
| 2012/0235045 A1* | 9/2012 | Kurashina | G01J 5/0225 |
| | | | 250/353 |
| 2012/0248478 A1* | 10/2012 | Lee | G02B 26/001 |
| | | | 257/91 |
| 2012/0249558 A1* | 10/2012 | Lee | B81B 7/0006 |
| | | | 345/501 |
| 2014/0166882 A1* | 6/2014 | Oulachgar | G01J 5/0834 |
| | | | 250/338.4 |
| 2017/0309758 A1* | 10/2017 | Frey | G01J 5/10 |

FOREIGN PATENT DOCUMENTS

| | | |
|---|---|---|
| CN | 103759838 A | 4/2014 |
| CN | 103776546 A | 5/2014 |
| CN | 103715307 B | 1/2016 |
| CN | 105486412 A | 4/2016 |
| CN | 106298827 A | 1/2017 |
| JP | 2008241438 A | 10/2008 |

OTHER PUBLICATIONS

Chinese Office Action issued in Chinese Patent Application No. 201610866664.5 dated Feb. 5, 2018, with English translation thereof.
International Search Report (Chinese and English) and Written Opinion (Chinese) issued in International Application No. PCT/CN2016/100865, dated Jul. 6, 2017; ISA/CN.

* cited by examiner

PIXEL FOR UNCOOLED INFRARED FOCAL PLANE DETECTOR AND PREPARATION METHOD THEREFOR

The present application is a national phase of international application No. PCT/CN2016/100865 filed on Sep. 29, 2016, which is incorporated herein by reference in its entirety.

FIELD

The present disclosure relates to a pixel for an uncooled infrared focal plane detector and a preparation method therefor, which relates to the technical field of uncooled infrared focal plane detectors.

BACKGROUND

With a gradually reduced pixel size, target radiant energy absorbed by a single sensor is significantly decreased. In order to maintain a relatively consistent sensitivity of sensors, response rates of the sensors must be increased. The response rate of the sensor depends on the pixel size, a thermal conductivity between the sensor and a substrate, an optical absorption efficiency of the sensor and properties of a thermal sensitive material. In a conventional two-layer micro-bridge structure, the first layer is a bridge leg support structure composed of spindly bridge legs for improving the thermal conductivity between the sensor and the substrate. The second layer contains a vanadium oxide layer for absorbing target infrared radiation and converting it into an electrical signal. When the infrared radiation is incident upon a pixel of the infrared detector, in addition to the top layer absorbing infrared radiation, the bridge legs at bottom absorb the incident infrared radiation as well, but have limited contribution to the temperature rise at the top layer. With the gradually reduced pixel size, the absorption efficiency of the top structure needs a further improvement.

Raytheon of US has applied for a patent (U.S. Pat. No. 6,690,014B1). This patent adopts a technical solution including a two-layer micro-bridge structure, wherein the first layer contains support bridge legs, and the second layer contains a thermal sensitive layer of amorphous silicon film. Although the structure can effectively detect infrared radiation, the area of the thermal sensitive layer may be reduced when the pixel size is reduced, thus resulting in a great decrease of the absorption rate. Therefore, this structure is not conducive to make a detector with ultra-small pixel size and a high response rate. In addition, a patent of DRS (U.S. Pat. No. 891,161 B2) adopts a structure similar to Raytheon, a two-layer structure is provided, wherein thermally insulated bridge legs in a first layer has a serpentine structure, a suspended detector is arranged in a second layer, and the two-layer structure in combination with a substrate form two resonant cavities. This structure has identical advantages and disadvantages as the Raytheon patent.

The uncooled infrared detection technology is a technology that does not require a cooling system to sense the infrared radiation (IR) of an external object, convert it into an electrical signal and output at a display terminal after processing. It can be widely used in many fields such as national defense, aerospace, medicine, production monitoring. The uncooled infrared focal plane detector is capable of operating at room temperature and has advantages of light weight, small size, long life, low cost, low power, fast start-up and good stability, thereby satisfying the urgent need for long-wave infrared detectors in civil infrared system and some military infrared systems. The uncooled infrared focal plane detector has been developing rapidly in recent years, to become of high sensitivity, wide spectrum, high resolution, low power consumption, miniaturization and intelligence. The uncooled infrared detectors mainly include bolometers, pyroelectric detectors, thermopile detectors and the like. The micro-bolometer infrared detector based on MEMS manufacturing process is one of mainstream technologies of the uncooled infrared detectors due to advantages of a high response rate, a simple manufacturing process which is compatibility with integrated circuit manufacturing process, a low crosstalk and low l/f noise, a high frame rate, no need for a chopper, which is apt for a large-scale production.

The micro-bolometer is an uncooled infrared detector that is manufactured based on materials having a thermal sensitive property whose resistance changes accordingly when the temperature changes. During operation, a source with a fixed bias voltage or current is applied to both terminals of a thermistor which is supported on a heat insulating structure. The temperature change caused by the incident infrared radiation causes a resistance of the thermistor to decrease, thereby changing the current and voltage, such that a readout integrated circuit (ROIC) reads the change of the electrical signal. The infrared detection process of the micro-bolometer is mainly done by a suspended micro-bridge structure, thus the manufacturing of the structure of the micro-bolometer is a key factor in determining performance thereof. The traditional structure is a two-layer structure with bridge legs at a bottom layer and a thermal sensitive layer at a top layer The contribution to the temperature rise of the thermal sensitive layer is mainly from the top layer structure, and the rest of structures such as the bridge-leg structure at bottom layer has relatively small contribution to the temperature rise, resulting in a lower sensitivity of the detector.

Chinese patent No. CN103715307B, titled "Uncooled Infrared Detector and Preparation Method therefor", discloses a preparation method and structure of an uncooled infrared detector. The patent adopts a single-layer micro bridge structure in which the bridge legs and the thermal sensitive layer are both in a same layer. The structure can effectively improve the absorption rate when making pixels having a large size. However, as the pixel size reduces, the structure can not meet the high absorbance requirement of pixels of the detector. Further, since a height of a resonant cavity of the structure is limited, only a limited infrared wavelength range, which is mainly from 8 to 14 μm, can be detected by the structure.

In view of this, it is necessary to develop a novel pixel of the uncooled infrared focal plane detector pixel, in order to address the issues in the conventional technology.

SUMMARY

One objective of the present disclosure is to provide a method of preparing a pixel of an uncooled infrared focal plane detector. The preparation method according to the present disclosure is simple, and capable to improve the compatibility with an integrated circuit, thereby achieving a large-scale production and reducing production cost.

The technical solution in the present disclosure for addressing the above technical issues is as follows. A method of preparing a pixel an uncooled infrared focal plane detector pixel includes the following steps.

At step 1, providing a semiconductor substrate including a readout integrated circuit, depositing a metal layer on the semiconductor substrate; patterning the metal layer to form a metal reflection layer pattern and a metal electrode block; where the metal electrode block is electrically connected to the readout integrated circuit on the semiconductor substrate; depositing an insulation dielectric layer on the patterned metal layer; depositing a first sacrificial layer on the insulation dielectric layer, performing a planarization processing on the first sacrificial layer, depositing a SiO$_2$ film as a first support layer on the first sacrificial layer after the planarization processing is completed; and depositing a silicon nitride film on the first support layer as a protection layer for the first support layer.

At step 2, etching a first through-hole by a method of photolithography and reactive ion etching in a direction from the protection layer for the first support layer to the semiconductor substrate, where the etching of the first through-hole is ended at the metal electrode block electrically connected to the readout integrated circuit.

At step 3, depositing a first metal electrode layer on the protection layer for the first support layer and at the bottom of the first through-hole, and patterning the first metal electrode layer to form a metal wiring and a metal electrode; depositing a first silicon nitride dielectric layer on the patterned first metal electrode layer; and sequentially etching, vertically downward from the first silicon nitride dielectric layer, the first silicon nitride dielectric layer, the first metal electrode layer, the protection layer for the first support layer, and the first support layer to form a bridge leg structure, wherein the etching is ended at the first sacrificial layer.

At step 4, depositing a second sacrificial layer on the bridge leg structure, performing a planarization processing on the second sacrificial layer, depositing a SiO$_2$ film as a second support layer on the second sacrificial layer after the planarization processing is completed; depositing a silicon nitride film on the second support layer as a protection layer for the second support layer; etching a second through-hole by a method of photolithography and reactive ion etching in a direction from the protection layer for the second support layer to the first metal electrode layer, where the etching of the second through-hole is ended at the first metal electrode layer.

At step 5, depositing a thermal sensitive layer on the protection layer for the second support layer, and patterning the thermal sensitive layer.

At step 6, depositing a silicon nitride film as a protection layer for the thermal sensitive layer on the thermal sensitive layer after the patterning the thermal sensitive layer is completed, and patterning the protection layer for the thermal sensitive layer; etching, by a method of photolithography and reactive ion etching on the protection layer for the thermal sensitive layer after the patterning protection layer for the thermal sensitive layer is completed, part of the protection layer for the thermal sensitive layer which is on the thermal sensitive layer, such that a contact hole is formed to expose the thermal sensitive layer.

At step 7, depositing a second metal electrode layer on the protection layer for the second support layer, the protection layer for the thermal sensitive layer, the contact hole and the bottom of the second through-hole, and patterning the second metal electrode layer;

At step 8, depositing a second silicon nitride dielectric layer on the second metal electrode layer after the patterning the second metal electrode layer is completed, and patterning the second silicon nitride dielectric layer.

At step 9, sequentially etching, vertically downward from the second silicon nitride dielectric layer after the patterning the second silicon nitride dielectric layer is completed, the second silicon nitride dielectric layer, the second metal electrode layer, the protection layer for the thermal sensitive layer, the thermal sensitive layer, and the protection layer for the second support layer, where the etching is ended at the second sacrificial layer; and a thermal conversion structure including micro bridge legs and thermal sensitive structure is formed.

At step 10, depositing a third sacrificial layer on the thermal conversion structure including the micro bridge legs and the thermal sensitive structure, and performing planarization processing on the third sacrificial layer, depositing a SiO$_2$ film as a third support layer on the third sacrificial layer after the planarization processing is completed; depositing an absorption layer film on the third support layer as an absorption layer; and depositing a silicon nitride film on the absorption layer as a protection layer of the absorption layer, such that an absorption layer structure is formed.

At step 11, sequentially etching, vertically downward from the protection layer of the absorption layer, the protection layer of the absorption layer, the absorption layer and the third support layer, where the etching is ended at the third sacrificial layer; and removing the first sacrificial layer, the second sacrificial layer and the third sacrificial layer, such that the novel pixel of the uncooled infrared focal plane detector pixel is obtained.

Based on the above technical solutions, the following modification may be further made to the present disclosure.

Further, at step 1, a thickness of the metal reflection layer is from 0.05 to 0.40 μm; the insulation dielectric layer is a silicon nitride film or a SiO$_2$ film, and a thickness of the insulation dielectric layer is from 0.02 to 0.30 μm; the first sacrificial layer is one of amorphous carbon, amorphous silicon, and polyimide; the SiO$_2$ film is deposited as the first support layer by a PECVD method; and a thickness of the first support layer is from 0.05 to 0.30 μm; the silicon nitride film is deposited as the protection layer for the first support layer by a PECVD method; and a thickness of the protection layer for the first support layer is from 0.05 to 0.30 μm.

An advantageous effect of the above further modification is to achieve the stability and flatness of the structure at each layer. The reflectance of the metal reflection layer to infrared light with a specific wavelength (e.g., 8-14 μm) is above 98%.

Further, at step 3, the first metal electrode layer is deposited by a PVD method, and the first metal electrode layer is one of a Ti film, a NiCr film and a TiN film; and a thickness of the first metal electrode layer is from 50 to 1500 angstrom; the first silicon nitride dielectric layer is depositing by a PEVCD method; and a thickness of the first silicon nitride dielectric layer is from 200 to 2000 angstrom.

Further, at step 4, the second sacrificial layer is one of an amorphous carbon, an amorphous silicon, a silicon oxide and a polyimide; a thickness of the second sacrificial layer is from 0.5 to 3 μm; the SiO$_2$ film is deposited as the second support layer by a PECVD method; a thickness of the second support layer is from 0.05 to 0.30 μm; the silicon nitride film is deposited as the protection layer for the second support layer by a PECVD method, and a thickness of the protection layer for the second support layer is from 0.05 to 0.30 μm.

Further, at step 5, the thermal sensitive layer is deposited by a method of ion beam deposition or physical vapor deposition; the thermal sensitive layer is a VOx film or an amorphous silicon film; a thickness of the thermal sensitive layer is from 500 to 3000 angstrom; a layer of V/V$_2$O$_5$/V film is deposited as a buffer layer before the depositing the thermal sensitive layer, a thickness of the V/V$_2$O$_5$/V film is from 10 to 200 angstrom.

Further, at step 6, the silicon nitride film is deposited as the protection layer for the thermal sensitive layer by a PECVD method; a thickness of the protection layer for the thermal sensitive layer is from 200 to 2000 angstrom; the contact hole is etched by using $SF_6$, $CHF_3$ and $O_2$, or $CF_4$ and $O_2$ as etching gas, and an endpoint detecting device is used for monitoring the endpoint of the etching reactions.

An advantageous effect of the above further modification is to effectively monitor the etching process by monitoring the etching reaction through EPD, such that an over etching of the electrodes is avoided and the thermal sensitive layer is prevented from being penetrated through.

Further, at step 10, the third sacrificial layer is one of an amorphous carbon, an amorphous silicon, a silicon oxide and a polyimide; a thickness of the third sacrificial layer is from 0.5 to 3 μm; the $SiO_2$ film is deposited as the third support layer by a PECVD method; a thickness of the third support layer is from 0.05 to 0.30 μm; material of the film at the absorption layer is one of graphene, carbon nanotube, titanium dioxide nanotube, zinc oxide nanotube and an alumina nanotube; and a thickness of the protection layer for the absorption layer is from 0.05 to 0.30 μm.

An advantageous effect of the above further modification is to broaden the absorption spectrum to the short-wave infrared and improve the absorption rate for a particular infrared band (e.g., 8-14 μm).

Further, at step 11, the first sacrificial layer, the second sacrificial layer and the third sacrificial layer are removed by using a resist remover, an ion etching machine or a plasma ashing machine.

A further advantageous effect of the above is that the removing of amorphous carbon by using a resist remover, an ion etching machine or a plasma ashing machine can be more complete, and carbon dioxide and water will be generated without polluting the environment.

Further, at step 1, step 4, step 6, and step 10, the stress of the silicon nitride film is from −50 to 100 MPa.

An advantageous effect of the above further modification is that the stress of the silicon nitride film is a low stress, i.e., from −50 to 100 MPa. Excessive tensile stress may cause the film to break, while excessive compressive stress causes the film to warp under the low stress described above. The stress range adopted by the silicon nitride film of the present disclosure can effectively prevent the film from being broken or warped.

The second objective of the present disclosure is to provide a pixel of an uncooled infrared focal plane detector. The pixel of the uncooled infrared focal plane detector according to the present disclosure can significantly improve the absorption rate of infrared radiation and the response rate of the detector, and lay a foundation for manufacturing a detector with a larger array and a smaller pixel.

The technical solution in the present disclosure to address the above technical issues is as follows. A pixel of uncooled infrared focal plane detector, including a semiconductor substrate including a readout integrated circuit and a pixel of the detector having a three-layer structure, where the pixel of the detector is electrically connected to the readout integrated circuit of the semiconductor substrate.

The pixel of the detector includes a structure having three layers sequentially from the semiconductor substrate upward, wherein the first layer is a bridge leg structure, the second layer is a thermal conversion structure, and the third layer is an absorption layer structure.

The bridge leg structure at the first layer includes a metal reflection layer, an insulation dielectric layer, a first support layer, a protection layer for the first support layer, a first metal electrode layer and a first silicon nitride dielectric layer.

The thermal conversion structure at the second layer includes a second support layer, a protection layer for the second support layer, a thermal sensitive layer, a protection layer for the thermal sensitive layer, a second metal electrode layer, and a second silicon nitride dielectric layer.

The absorption layer structure at the third layer includes a third support layer, an absorption layer and a protection layer for the absorption layer.

The metal reflection layer and the insulation dielectric layer are sequentially disposed on the readout integrated circuit of the semiconductor substrate.

The first support layer is disposed on the insulation dielectric layer.

The protection layer for the first support layer, the first metal electrode layer and the first silicon nitride dielectric layer are sequentially disposed on the first support layer.

The second support layer is disposed on the first silicon nitride dielectric layer;

The protection layer for the second support layer, the thermal sensitive layer, the protection layer for the thermal sensitive layer, the second metal electrode layer and the second silicon nitride dielectric layer are sequentially disposed on the second support layer.

The third support layer is disposed on the second silicon nitride dielectric layer;

The absorption layer and the protection layer for the absorption layer are sequentially disposed on the third support layer.

In the present disclosure, the bridge leg structure of the first layer is a bottom layer, which adopts a bridge support structure with dense spindly bridge legs and is for thermal insulation between the sensor and the substrate.

The thermoelectric conversion structure of the second layer further includes the micro bridge legs and the thermal sensitive structure, so that the length of the bridge leg of the overall structure is lengthened, the thermal insulation of the detector can be better, thereby reducing the influence of the ambient temperature, reducing thermal conductivity, and improving the performance of the detector.

The absorption layer of the third layer is a top layer, which adopts a sub-wavelength absorption structure, and can effectively broaden the infrared absorption spectrum range, increase the absorption rate at the band from 8 to 14 μm, such that the thermoelectric conversion structure at the second layer that is connected to the third layer structure may have a greater thermal response.

On the basis of the above technical solutions, the following modifications may be further made to the present invention.

Further, the insulation dielectric layer is a silicon nitride film; the first support layer is a $SiO_2$ film; the protection layer for the first support layer is a silicon nitride film; and the second support layer is a $SiO_2$ film; the protection layer for the second support layer is a silicon nitride film; the thermal sensitive layer is a VOx film or an amorphous silicon film; the protection layer for the thermal sensitive layer is a silicon nitride film; and the third support layer is a $SiO_2$ film.

The present disclosure has the following advantages:

1. The pixel of the uncooled infrared focal plane detector according to the present disclosure adopts a three-layer structure, and the thermal conversion structure at the second layer is located between the bridge leg structure at the first layer and the absorption layer structure ay the third layer.

Therefore, the filling factor can be effectively improved when making a detector with a small pixel. Further, the detection range can be expanded from a range from 8 to 14 μm to a sub-wavelength band which is much wider by the structure of the pixel of the detector.

2. The pixel of the uncooled infrared focal plane detector according to the present disclosure can achieve thermal insulation between the thermal sensitive unit and the substrate, thereby reducing the influence of changes in ambient temperature on an output of the detector and increasing the sensitivity of the detector.

3. The pixel of the uncooled infrared focal plane detector according to the present disclosure can significantly improve the absorption rate of infrared radiation, broaden the infrared absorption spectrum range, and improve the response rate of the detector, thereby laying a foundation for manufacturing a detector with a larger array and a smaller pixel.

4. The method according to the present disclosure is compatible with integrated circuit process and thus is apt for large-scale production.

Figure 1:
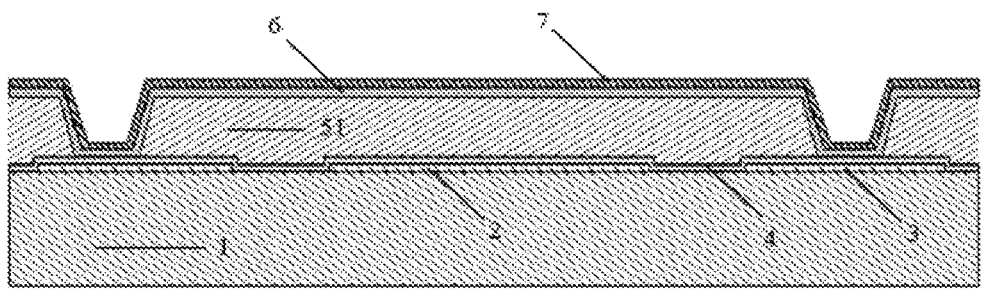
FIG. 1 is a schematic diagram showing a process of forming a metal reflection layer, a first sacrificial layer, a first support layer and a protection layer for the first support layer according to the present disclosure.

In the drawings, the correspondence between reference numerals and the elements is as follows.

1. semiconductor substrate, 2. metal reflection layer, 3. metal electrode block, 4. insulation dielectric layer, 51. first sacrificial layer, 52. second sacrificial layer, 53. third sacrificial layer, 6. first support layer, 7. protection layer for first support layer, 8. first through-hole, 9. first metal electrode layer, 91. metal wiring, 92. metal electrode, 10. first silicon nitride dielectric layer, 11. second support layer, 12. protection layer for second support layer, 13. second through-hole, 14. second metal electrode layer, 15. second silicon nitride dielectric layer, 16. contact hole, 17. thermal sensitive layer, 18. protection layer for thermal sensitive layer, 19. third support layer, 20. absorption layer, 21. protection layer for absorption layer.

DETAILED DESCRIPTION

Hereinafter, the principles and features of the present disclosure will be described in conjunction with drawings. Embodiments are only for explaining the present disclosure and are not intended to limit the scope of the present disclosure.

A method of preparing a pixel of an uncooled infrared focal plane detector includes the following steps 1 to 11.

At step 1, as shown in FIG. 1, a semiconductor substrate 1 including a readout integrated circuit (not shown) is provided; a metal layer is deposited on the semiconductor substrate 1. The metal layer is patterned to form a metal reflection layer 2 pattern and a metal electrode block 3, a thickness of the metal reflection layer 2 is from 0.05 to 0.40 μm. The metal electrode block 3 is electrically connected to the readout integrated circuit on the semiconductor substrate 1. An insulation dielectric layer 4 is deposited on the patterned metal layer, the insulation dielectric layer 4 is a silicon nitride film or a $SiO_2$ film having a stress from −50 to 100 MPa, and a thickness of the insulation dielectric layer 4 is from 0.02 to 0.30 μm. A first sacrificial layer 51 is deposited on the insulation dielectric layer 4, the first sacrificial layer 51 is one of an amorphous carbon, an amorphous silicon and a polyimide, and then a planarization processing is performed on the first sacrificial layer 51. A $SiO_2$ film is deposited by a PECVD method on the first sacrificial layer 51 as a first support layer 6 after the planarization processing is completed; and a silicon nitride film having a stress from −50 to 100 MPa is deposited on the first support layer 6 as a protection layer 7 for the first support layer; where a thickness of the first support layer 6 is from 0.05 to 0.30 μm.

Figure 2:
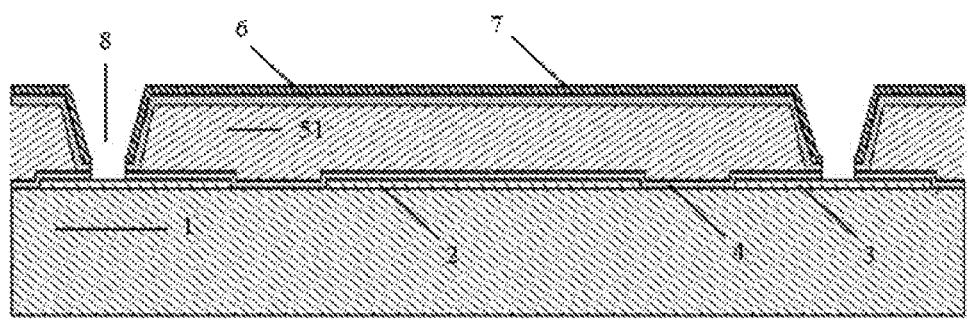
FIG. 2 is a schematic diagram showing a process of forming a first through-hole according to the present disclosure.

At step 2, as shown in FIG. 2, a first through-hole 8 is etched by a method of photolithography and reactive ion etching in a direction from the protection layer 7 for the first support layer to the semiconductor substrate 1, where the etching of the first through-hole 8 is ended at the metal electrode block 3 that is electrically connected to the readout integrated circuit.

Figure 3:
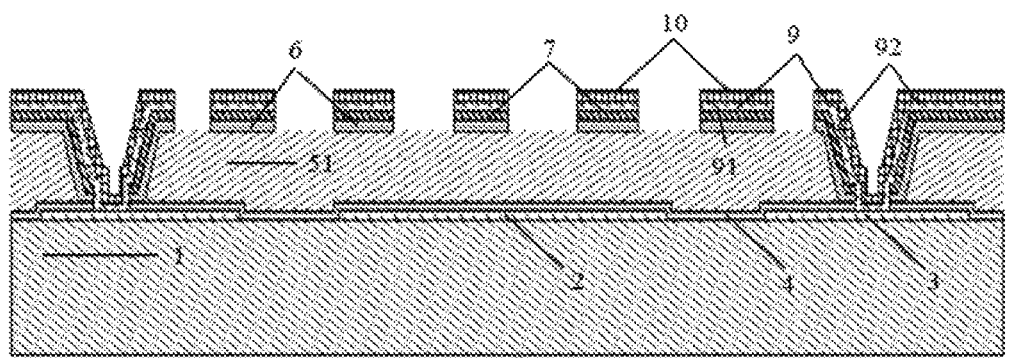
FIG. 3 is a schematic diagram showing a process of forming a first metal electrode layer and a first bridge leg structure of the first layer according to the present disclosure.
Figure 4:
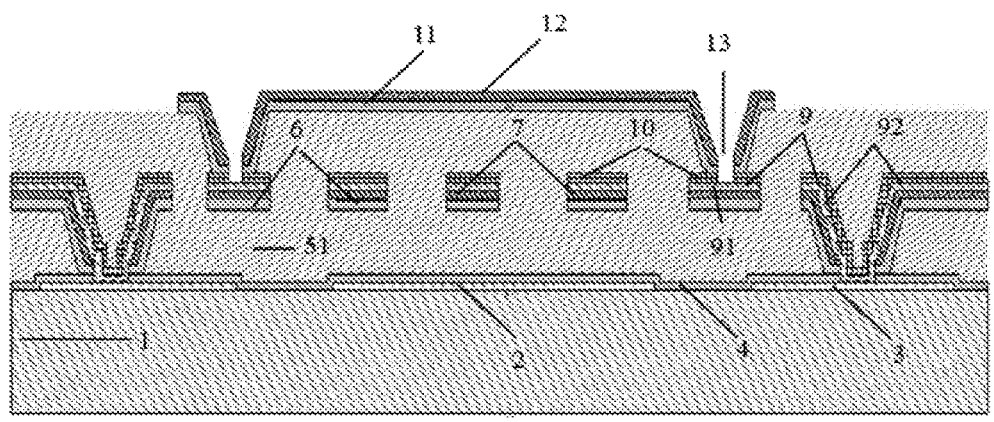
FIG. 4 is a schematic diagram showing a process of forming a second sacrificial layer, a second support layer and a protection layer for the second support layer according to the present disclosure.

At step 3, as shown in FIG. 3, a first metal electrode layer 9 is deposited by a PVD method on the protection layer 7 for the first support layer and at the bottom of the first through-hole 8, where the first metal electrode layer 9 is one of a Ti film, a NiCr film and a TiN film, and a thickness of the first metal electrode layer 9 is from 50 to 1500 angstrom. The first metal electrode layer 9 is patterned to form a metal wiring 91 and a metal electrode 92. A first silicon nitride dielectric layer 10 is deposited by a PEVCD method on the patterned first metal electrode layer 9, where a thickness of the first silicon nitride dielectric layer 10 is from 200 to 2000 angstrom; and then vertically downward from the first silicon nitride dielectric layer 10, the first silicon nitride dielectric layer 10, the first metal electrode layer 9, the protection layer 7 for the first support layer and the first support layer 6 are sequentially etched, where the etching is ended at the first sacrificial layer 51. A bridge leg structure is formed;

At step 4, as shown in FIG. 4, a second sacrificial layer 52 is deposited on the bridge leg structure, where the second sacrificial layer 52 is one of an amorphous carbon, an amorphous silicon, a silicon oxide and a polyimide, and a thickness of the second sacrificial layer 52 is from 0.5 to 3 μm. Then, a planarization processing is performed on the second sacrificial layer 52, a $SiO_2$ film is deposited by a PECVD method as a second support layer 11 on the second sacrificial layer 52 after the planarization processing is completed, and a thickness of the second support layer is from 0.05 to 0.30 μm. A silicon nitride film having a stress from −50 to 100 MPa is deposited by a PECVD method on the second support layer 11 as a protection layer 12 for the second support layer, where a thickness of the protection layer 12 for the second support layer is from 0.05 to 0.30 μm. A second through-hole 13 is etched by a method of photolithography and reactive ion etching in a direction from the protection layer 12 for the second support layer to the first metal electrode layer 9, where the etching of the second through-hole 13 is ended at the first metal electrode layer 9.

Figure 5:
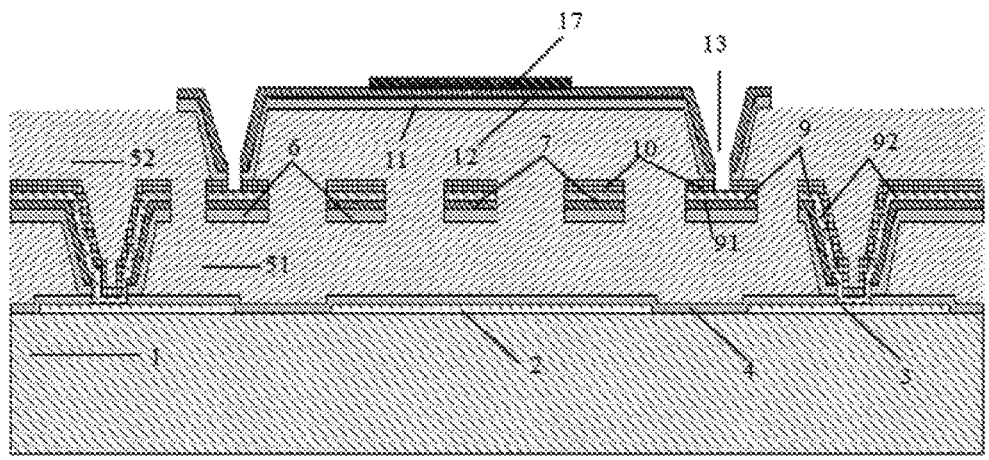
FIG. 5 is a schematic diagram showing a process of forming a thermal sensitive layer according to the present disclosure.

At step 5, as shown in FIG. 5, a thermal sensitive layer 17 is deposited on the protection layer 12 for the second support layer by a method of ion beam deposition or physical vapor deposition, where the thermal sensitive layer 17 is a VOx film or an amorphous silicon film, and a thickness of the thermal sensitive layer 17 is from 500 to 3000 angstrom. Before the deposition of the thermal sensitive layer, a layer of $V/V_2O_5/V$ film is deposited as a buffer layer, where a thickness of the $V/V_2O_5/V$ film is from 10 to 200 angstrom. The thermal sensitive layer 17 is patterned.

Figure 6:
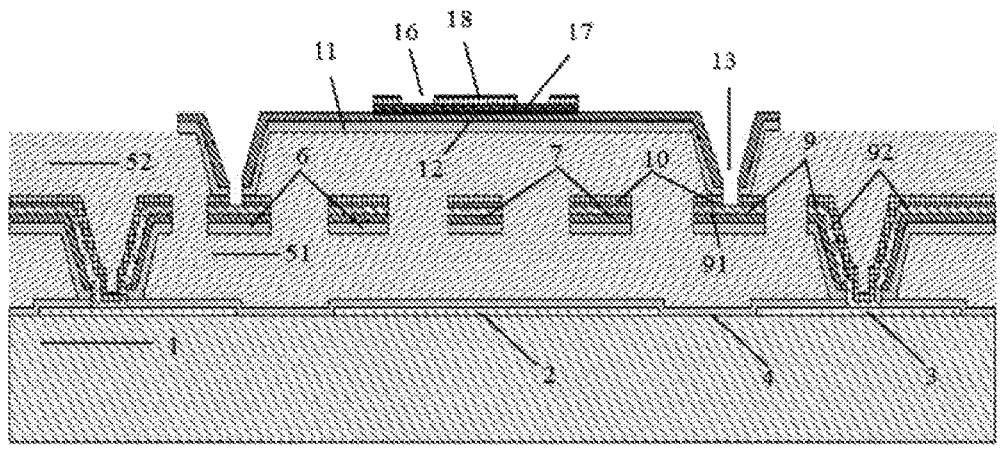
FIG. 6 is a schematic diagram showing a process of forming a protection layer for the thermal sensitive layer and a contact hole according to the present disclosure.

At step 6, as shown in FIG. 6, a silicon nitride film having a stress from −50 to 100 MPa is deposited by a PECVD method as a protection layer 18 for the thermal sensitive layer on the thermal sensitive layer 17 after the patterning process is completed, where a thickness of the protection layer 18 for the thermal sensitive layer is from 200 to 2000 angstrom, and the protection layer 18 for the thermal sensitive layer is patterned. Part of the protection layer 18 for the thermal sensitive layer which is the thermal sensitive layer 17 is etched away by a method of photolithography and reactive ion etching performed on the protection layer 18 for the thermal sensitive layer after the patterning process is completed, so as to form a contact hole 16 to expose the thermal sensitive layer 17, where the contact hole 16 is etched using $SF_6$, $CHF_3$ and $O_2$, or using $CF_4$ and $O_2$ as etching gas. Since the thickness of the mental electrode layer is extremely thin, an endpoint detecting device is used for monitoring an endpoint of the etching reaction during the etching process, thereby avoiding over etching the metal electrode layer.

Figure 7:
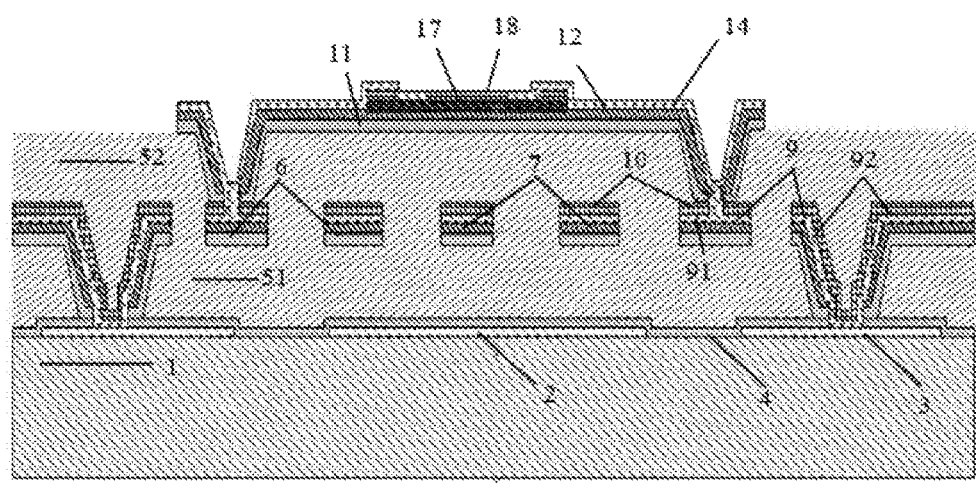
FIG. 7 is a schematic diagram showing a process of forming a second metal electrode layer according to the present disclosure.

At step 7, as shown in FIG. 7, a second metal electrode layer 14 is deposited on the protection layer 12 for the second support layer, the protection layer 18 for the thermal sensitive layer, the contact hole 16 and the bottom of the second through-hole 13 by a PVD method, where the second metal electrode layer 14 is one of a Ti film, a NiCr film and a TiN film, and a thickness of the second metal electrode layer 14 is from 50 to 1500 angstrom. The second metal electrode layer 14 is patterned.

Figure 8:
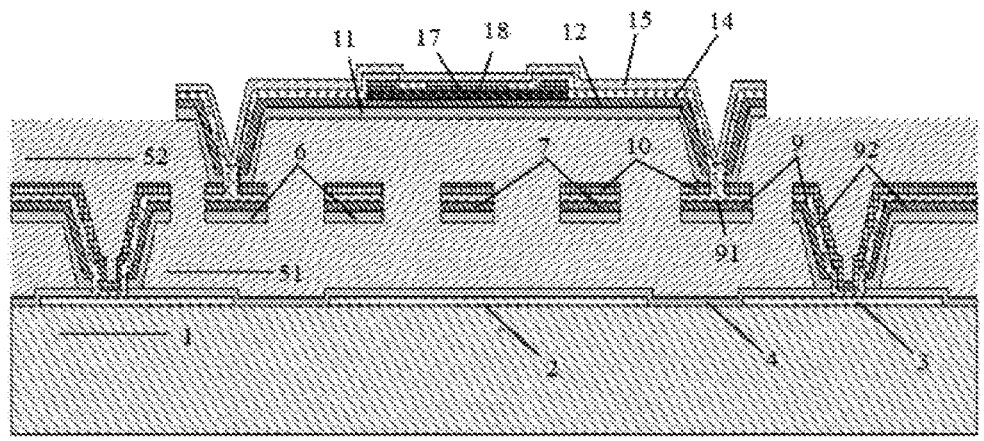
FIG. 8 is a schematic diagram showing a process of forming a second silicon nitride dielectric layer according to the present disclosure.

At step 8, as shown in FIG. 8, a second silicon nitride dielectric layer 15 is deposited by a PECVD method on the second metal electrode layer 14 after the patterning process is completed, where a thickness of the second silicon nitride dielectric layer 15 is from 200 to 2000 angstrom, and the second silicon nitride dielectric layer 15 is patterned.

Figure 9:
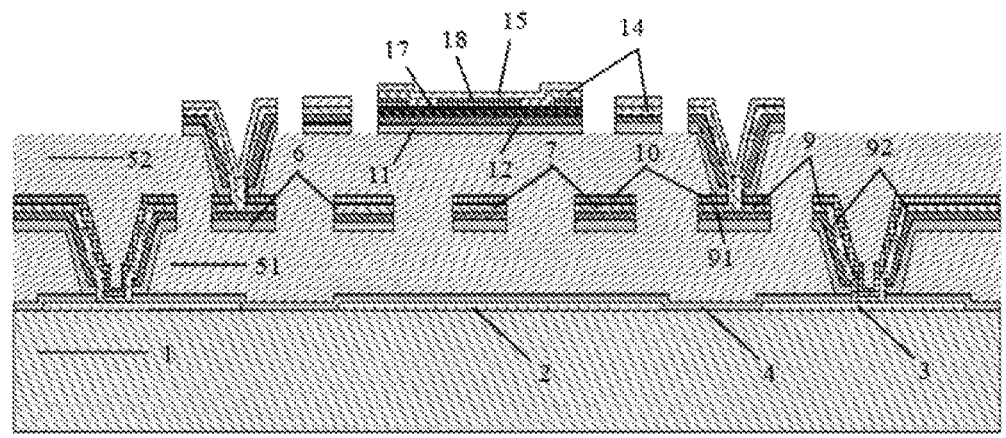
FIG. 9 is a schematic diagram showing a process of forming a thermal conversion structure of the second layer structure according to the present disclosure.

At step 9, as shown in FIG. 9, vertically downward from the second silicon nitride dielectric layer 15 after the patterning process is completed, the second silicon nitride dielectric layer 15, the second metal electrode layer 14, the protection layer 18 for the thermal sensitive layer, the thermal sensitive layer 17, and the protection layer 12 for the second support layer are sequentially etched, where the etching is ended at the second sacrificial layer 52. A thermal conversion structure including micro bridge legs and a thermal sensitive structure is formed.

Figure 10:
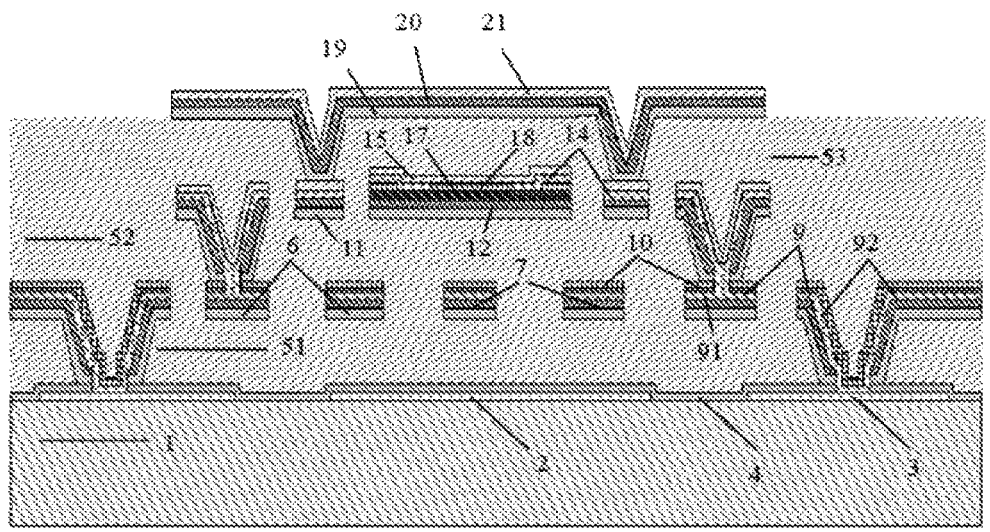
FIG. 10 is a schematic diagram showing a process of forming a third sacrificial layer, a third support layer, an absorption layer and a protection layer for the absorption layer according to the present disclosure.

At step 10, as shown in FIG. 10, a third sacrificial layer 53 is deposited on the thermal conversion structure including the micro bridge legs and the thermal sensitive structure, where the third sacrificial layer 53 is one of an amorphous carbon, an amorphous silicon, a silicon oxide and a polyimide and a thickness of the third sacrificial layer 53 is from 0.5 to 3 μm. A planarization processing is performed on the third sacrificial layer 53, a $SiO_2$ film is deposited by a PECVD method as a third support layer 19 on the third sacrificial layer 53 after the planarization processing is completed, where a thickness of the third support layer 19 is from 0.05 to 0.30 μm. An absorption layer film is deposited on the third support layer 19 as an absorption layer 20. A silicon nitride film having a stress from −50 to 100 MPa is deposited on the absorption layer 20 as a protection layer 21 for the absorption layer. The material of the absorption layer film is one of graphene, carbon nanotube, titanium dioxide nanotube, zinc oxide nanotube and alumina nanotube, and the thickness of the protection layer 21 for the absorption layer is from 0.05 to 0.30 μm. A n absorption layer structure is formed.

Figure 11:
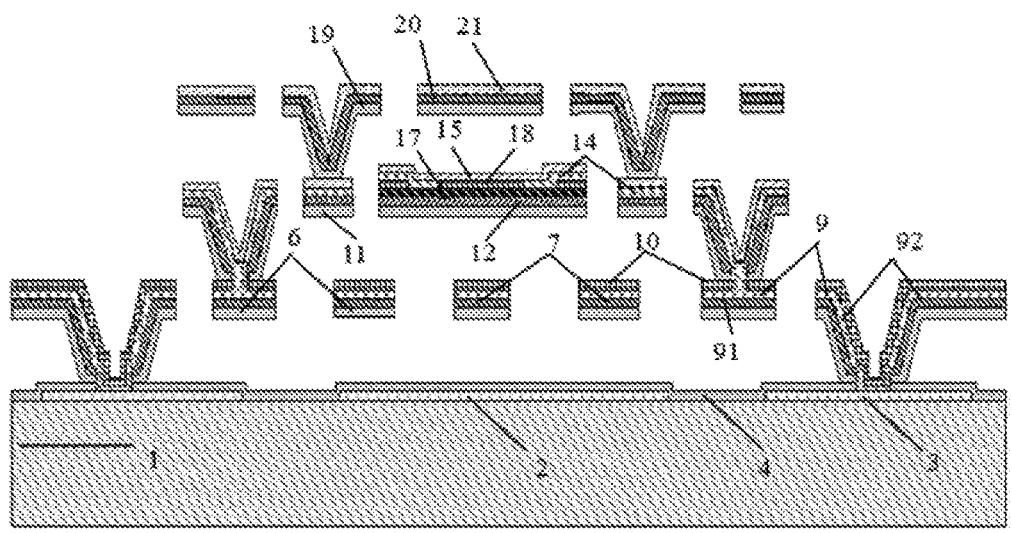
FIG. 11 is a schematic diagram showing a process of forming a three-layer micro-bridge structure according to the present disclosure.
Figure 12:
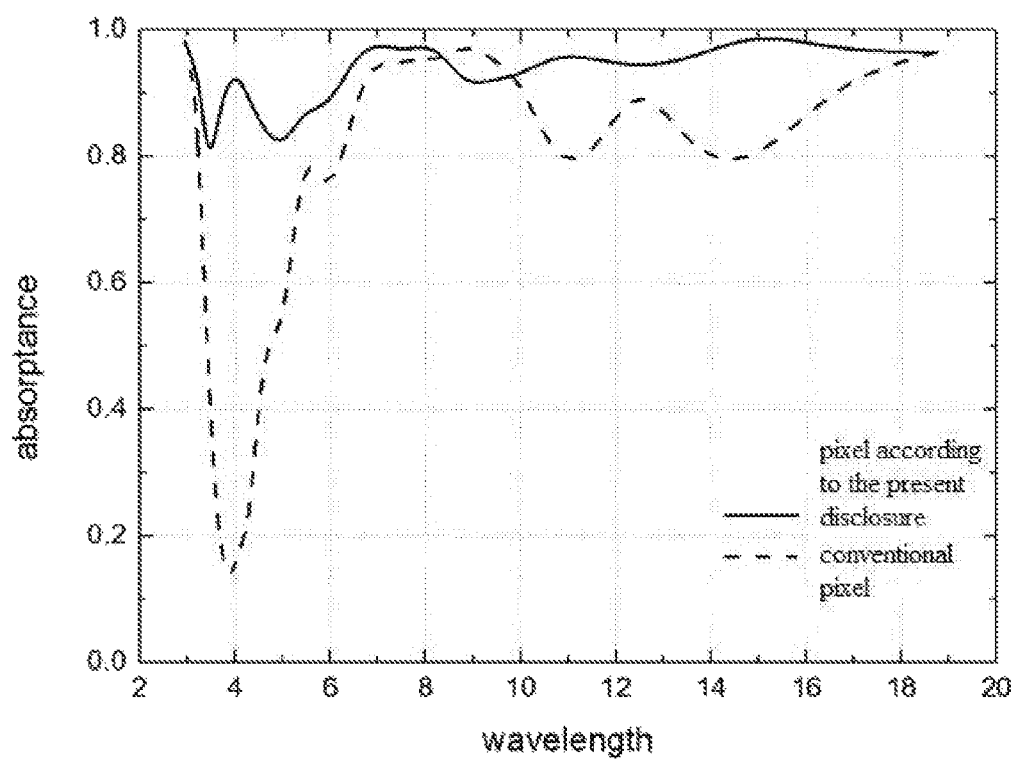
FIG. 12 is a graph comparing the absorbance of the pixel according to the present disclosure with that of a conventional pixel.

A pixel of an uncooled infrared focal plane detector, as shown in FIG. 11, includes a semiconductor substrate including a readout integrated circuit and a pixel of the detector having a three-layer structure, the pixel of the detector is electrically connected to the readout integrated circuit of the semiconductor substrate.

From the semiconductor substrate 1 upward, the pixel of the detector includes a structure sequentially having three layers, where the first layer is a bridge leg structure, the second layer is a thermal conversion structure, and the third layer is an absorption layer structure.

The bridge leg structure at the first layer includes a metal reflection layer 2, an insulation dielectric layer 4, a first support layer 6, a protection layer 7 for the first support layer, a first metal electrode layer 9 and a first silicon nitride dielectric layer 10.

The thermal conversion structure at the second layer includes a second support layer 11, a protection layer 12 for the second support layer, a thermal sensitive layer 17, a protection layer 18 for the thermal sensitive layer, a second metal electrode layer 14, and a second silicon nitride dielectric layer 15.

The absorption layer structure of the third layer includes a third support layer 19, an absorption layer 20 and a protection layer 21 for the absorption layer.

The metal reflection layer 2 and the insulation dielectric layer 4 are sequentially disposed on the readout integrated circuit of the semiconductor substrate 1.

The first support layer 6 is disposed on the insulation dielectric layer 4.

The protection layer 7 for the first support layer, the first metal electrode layer 9 and the first silicon nitride dielectric layer 10 are sequentially disposed on the first support layer 6.

The second support layer 11 is disposed on the first silicon nitride dielectric layer 10.

The protection layer 12 for the second support layer, the thermal sensitive layer 17, the protection layer 18 for the thermal sensitive layer, the second metal electrode layer 14 and the second silicon nitride dielectric layer 15) are sequentially disposed on the second support layer 11.

The third support layer 19 is disposed on the second silicon nitride dielectric layer 15;

The absorption layer 20 and the protection layer 21 for the absorption layer are sequentially disposed on the third support layer 19.

The insulation dielectric layer 4 is a silicon nitride film; the first support layer 6 is a $SiO_2$ film; the protection layer 7 for the first support layer is a silicon nitride film; the second support layer 11 is a $SiO_2$ film; the protection layer 12 for the second support layer is a silicon nitride film; the thermal sensitive layer 17 is a VOx film or an amorphous silicon film; the protection layer 18 for the thermal sensitive layer is a silicon nitride film; and the third support layer 19 is a $SiO_2$ film.

As shown in FIG. 10, the absorption rate of a pixel according to the present disclosure is compared with that of a conventional pixel in the conventional technology. The pixel structure of the present disclosure has an absorption rate of more than 80% at a band from 3 to 14 μm, and has an absorption rate of more than 90% at a band from 8 to 14 μm. However, the structure in the conventional technology has a very low absorption rate at a band from 3 to 5 μm, which is only 15-40%, and has an absorption rate of only about 80% at the band from 8 to 14 μm. It can be seen that the uncooled infrared focal plane detector pixel according to the present disclosure can significantly improve the absorption rate of infrared radiation, broaden the infrared absorption spectrum range, and improve the response rate of the detector, thereby laying a foundation for manufacturing a detector with a larger array and a smaller pixel.

The above description is only preferred embodiments of the present disclosure, and is not intended to limit the present disclosure. Any modifications, equivalent substitutions, alternations and the like made within the spirit and principles of the present disclosure, fall within the scope of the present disclosure.

The invention claimed is:

1. A method of preparing a pixel of an uncooled infrared focal plane detector, comprising:
   step 1, providing a semiconductor substrate comprising a readout integrated circuit;
   depositing a metal layer on the semiconductor substrate;
   patterning the metal layer to form a metal reflection layer pattern and a metal electrode block; wherein the metal electrode block is electrically connected to the readout integrated circuit on the semiconductor substrate;
   depositing an insulation dielectric layer on the patterned metal layer;
   depositing a first sacrificial layer on the insulation dielectric layer, and performing a planarization processing on the first sacrificial layer;
   depositing a $SiO_2$ film on the first sacrificial layer as a first support layer after the planarization processing is completed; and
   depositing a silicon nitride film on the first support layer as a protection layer for the first support layer;
   step 2, etching a first through-hole by a method of photolithography and reactive ion etching in a direction from the protection layer for the first support layer to the semiconductor substrate, wherein the etching of the first through-hole is ended at the metal electrode block that is electrically connected to the readout integrated circuit;
   step 3, depositing a first metal electrode layer on the protection layer for the first support layer and at the bottom of the first through-hole, and patterning the first metal electrode layer to form a metal wiring and a metal electrode;
   depositing a first silicon nitride dielectric layer on the patterned first metal electrode layer; and
   sequentially etching, vertically downward from the first silicon nitride dielectric layer, the first silicon nitride dielectric layer, the first metal electrode layer, the protection layer for the first support layer and the first support layer to form a bridge leg structure, wherein the etching is ended at the first sacrificial layer;
   step 4, depositing a second sacrificial layer on the bridge leg structure, and performing a planarization processing on the second sacrificial layer,
   depositing a SiO2 film as a second support layer on the second sacrificial layer after the planarization processing is completed;
   depositing a silicon nitride film on the second support layer as a protection layer for the second support layer;
   etching a second through-hole by a method of photolithography and reactive ion etching in a direction from the protection layer for the second support layer to the first metal electrode layer, wherein the etching of the second through-hole is ended at the first metal electrode layer;
   step 5, depositing a thermal sensitive layer on the protection layer for the second support layer, and patterning the thermal sensitive layer;
   step 6, depositing a silicon nitride film as a protection layer for the thermal sensitive layer on the thermal sensitive layer after the patterning the thermal sensitive layer is completed,
   patterning the protection layer for the thermal sensitive layer;
   etching, by a method of photolithography and reactive ion etching on the protection layer for the thermal sensitive layer after the patterning the protection layer for the thermal sensitive layer is completed, part of the protection layer for the thermal sensitive layer which is on the thermal sensitive layer, such that and a contact hole is formed to expose the thermal sensitive layer;
   step 7, depositing a second metal electrode layer on the protection layer for the second support layer, the protection layer for the thermal sensitive layer, the contact hole and the bottom of the second through-hole, and patterning the second metal electrode layer;
   step 8, depositing a second silicon nitride dielectric layer on the second metal electrode layer after the patterning the second metal electrode layer is completed, and patterning the second silicon nitride dielectric layer;
   step 9, sequentially etching, vertically downward from the second silicon nitride dielectric layer after the patterning the second silicon nitride dielectric layer is completed, the second silicon nitride dielectric layer, the second metal electrode layer, the protection layer for the thermal sensitive layer, the thermal sensitive layer, and the protection layer for the second support layer, wherein the etching is ended at the second sacrificial layer, and a thermal conversion structure including micro bridge legs and a thermal sensitive structure is formed;

step 10, depositing a third sacrificial layer on the thermal conversion structure including the micro bridge legs and the thermal sensitive structure, and performing a planarization processing on the third sacrificial layer;

depositing a $SiO_2$ film as a third support layer on the third sacrificial layer after the planarization processing is completed;

depositing an absorption layer film on the third support layer as an absorption layer; and depositing a silicon nitride film on the absorption layer as a protection layer of the absorption layer, and an absorption layer structure is formed;

step 11, sequentially etching, vertically downward from the protection layer of the absorption layer, the protection layer of the absorption layer, the absorption layer and the third support layer, wherein the etching is ended at the third sacrificial layer;

removing the first sacrificial layer, the second sacrificial layer and the third sacrificial layer, such that the pixel of the uncooled infrared focal plane detector is obtained.

2. The method of preparing the pixel of the uncooled infrared focal plane detector according to claim 1, wherein at step 1, a thickness of the metal reflection layer is from 0.05 to 0.40 μm; the insulation dielectric layer is a silicon nitride film or a $SiO_2$ film, a the thickness of the insulation dielectric layer is from 0.02 to 0.30 μm; the first sacrificial layer is one of amorphous carbon, amorphous silicon, and polyimide; the $SiO_2$ film is deposited as the first support layer by a PECVD method; and a thickness of the first support layer is from 0.05 to 0.30 μm; the silicon nitride film is deposited as the protection layer for the first support layer by a PECVD method; and a thickness of the protection layer for the first support layer is from 0.05 to 0.30 μm.

3. The method of preparing the pixel of the uncooled infrared focal plane detector according to claim 1, wherein at step 3, the first metal electrode layer is deposited by a PVD method, and the first metal electrode layer is one of a Ti film, a NiCr film and a TiN film; and a thickness of the first metal electrode layer is from 50 to 1500 angstrom; the first silicon nitride dielectric layer is deposited by a PEVCD method; and a thickness of the first silicon nitride dielectric layer is from 200 to 2000 angstrom.

4. The method of preparing the pixel of the uncooled infrared focal plane detector according to claim 1, wherein at step 4, the second sacrificial layer is one of an amorphous carbon, an amorphous silicon, a silicon oxide and a polyimide; a thickness of the second sacrificial layer is from 0.5 to 3 μm; the $SiO_2$ film is deposited as the second support layer by a PECVD method; a thickness of the second support layer is from 0.05 to 0.30 μm; the silicon nitride film is deposited as the protection layer for the second support layer by a PECVD method, and a thickness of the protection layer for the second support layer is from 0.05 to 0.30 μm.

5. The method of preparing the pixel of the uncooled infrared focal plane detector according to claim 1, wherein at step 5, the thermal sensitive layer is deposited by a method of ion beam deposition or physical vapor deposition; the thermal sensitive layer is a VOx film or an amorphous silicon film; a thickness of the thermal sensitive layer is from 500 to 3000 angstrom; a layer of $V/V_2O_5/V$ film is deposited as a buffer layer before the depositing the thermal sensitive layer, a thickness of the $V/V_2O_6/V$ film is from 10 to 200 angstrom;

wherein at step 6, the silicon nitride film is deposited as the protection layer for the thermal sensitive layer by a PECVD method; a thickness of the protection layer for the thermal sensitive layer is from 200 to 2000 angstrom; the contact hole is etched by using $SF_6$, $CHF_3$ and $O_2$, or using $CF_4$ and $O_2$ as etching gas, and an endpoint detecting device is used for monitoring endpoints of the etching reactions.

6. The method of preparing the pixel of the uncooled infrared focal plane detector according to claim 1, wherein at step 7, the second metal electrode layer is deposited by a PVD method, the second metal electrode layer is one of a Ti film, a NiCr film and a TiN film, a thickness of the second metal electrode layer is from 50 to 1500 angstrom; and wherein at step 8, the second silicon nitride dielectric layer is deposited by a PEVCD method, a thickness of the second silicon nitride dielectric layer is from 200 to 2000 angstrom.

7. The method of preparing the pixel of the uncooled infrared focal plane detector according to claim 1, wherein at step 10, the third sacrificial layer is one of an amorphous carbon, an amorphous silicon, a silicon oxide and a polyimide; a thickness of the third sacrificial layer is from 0.5 to 3 μm; the $SiO_2$ film is deposited as the third support layer by a PECVD method; a thickness of the third support layer is from 0.05 to 0.30 μm; materials of the film at the absorption layer is one of graphene, carbon nanotube, titanium dioxide nanotube, zinc oxide nanotube and an alumina nanotube; and a thickness of the protection layer for the absorption layer is from 0.05 to 0.30 μm.

8. The method of preparing the pixel of the uncooled infrared focal plane detector according to claim 1, wherein at step 11, the first sacrificial layer, the second sacrificial layer and the third sacrificial layer are removed by using a resist remover, an ion etching machine or a plasma ashing machine.

9. A pixel of an uncooled infrared focal plane detector, comprising:

a semiconductor substrate comprising a readout integrated circuit and a pixel of the detector having a three-layer structure, wherein the pixel of the detector is electrically connected to the readout integrated circuit of the semiconductor substrate, wherein, the pixel of the detector comprises a structure having three layers sequentially disposed on the semiconductor substrate, wherein the first layer is a bridge leg structure, the second layer is a thermal conversion structure, and the third layer is an absorption layer structure;

the bridge leg structure at the first layer comprises a metal reflection layer, an insulation dielectric layer, a first support layer, a protection layer for the first support layer, a first metal electrode layer and a first silicon nitride dielectric layer;

the thermal conversion structure at the second layer comprises a second support layer, a protection layer for the second support layer, a thermal sensitive layer, a protection layer for the thermal sensitive layer, a second metal electrode layer and a second silicon nitride dielectric layer;

the absorption layer structure at the third layer comprises a third support layer, an absorption layer and a protection layer for the absorption layer;

wherein the metal reflection layer and the insulation dielectric layer are sequentially disposed on the readout integrated circuit of the semiconductor substrate;

the first support layer is disposed on the insulation dielectric layer;

the protection layer for the first support layer, the first metal electrode layer and the first silicon nitride dielectric layer are sequentially disposed on the first support layer;

the second support layer is disposed on the first silicon nitride dielectric layer;

the protection layer for the second support layer, the thermal sensitive layer, the protection layer for the thermal sensitive layer, the second metal electrode layer and the second silicon nitride dielectric layer are sequentially disposed on the second support layer;

the third support layer is disposed on the second silicon nitride dielectric layer;

the absorption layer and the protection layer for the absorption layer are sequentially disposed on the third support layer.

10. The pixel of the uncooled infrared focal plane detector according to claim 9, wherein the insulation dielectric layer is a silicon nitride film; the first support layer is a SiO$_2$ film; the protection layer for the first support layer is a silicon nitride film; the second support layer is a SiO$_2$ film; the protection layer for the second support layer is a silicon nitride film; the thermal sensitive layer is a VOx film or an amorphous silicon film; the protection layer for the thermal sensitive layer is a silicon nitride film; and the third support layer is a SiO$_2$ film.

11. The pixel of the uncooled infrared focal plane detector according to claim 10, wherein the stress of the silicon nitride film is from −50 to 100 MPa.

12. The pixel of the uncooled infrared focal plane detector according to claim 9, wherein a thickness of the metal reflection layer is from 0.05 to 0.40 μm; the insulation dielectric layer is a silicon nitride film or a SiO$_2$ film, a the thickness of the insulation dielectric layer is from 0.02 to 0.30 μm; the first sacrificial layer is one of amorphous carbon, amorphous silicon, and polyimide; a thickness of the first support layer is from 0.05 to 0.30 μm; and a thickness of the protection layer for the first support layer is from 0.05 to 0.30 μm.

13. The pixel of the uncooled infrared focal plane detector according to claim 9, wherein the first metal electrode layer is one of a Ti film, a NiCr film and a TiN film; a thickness of the first metal electrode layer is from 50 to 1500 angstrom; and a thickness of the first silicon nitride dielectric layer is from 200 to 2000 angstrom.

14. The pixel of the uncooled infrared focal plane detector according to claim 9, wherein the second sacrificial layer is one of an amorphous carbon, an amorphous silicon, a silicon oxide and a polyimide; a thickness of the second sacrificial layer is from 0.5 to 3 μm; a thickness of the second support layer is from 0.05 to 0.30 μm; and a thickness of the protection layer for the second support layer is from 0.05 to 0.30 μm.

15. The pixel of the uncooled infrared focal plane detector according to claim 9, wherein the thermal sensitive layer is a VOx film or an amorphous silicon film; a thickness of the thermal sensitive layer is from 500 to 3000 angstrom; a layer of V/V$_2$O$_5$/V film is deposited as a buffer layer between the thermal sensitive layer and the protection layer for the second support layer, a thickness of the V/V$_2$O$_5$/V film is from 10 to 200 angstrom; and a thickness of the protection layer for the thermal sensitive layer is from 200 to 2000 angstrom.

16. The pixel of the uncooled infrared focal plane detector according to claim 9, wherein the second metal electrode layer is one of a Ti film, a NiCr film and a TiN film, a thickness of the second metal electrode layer is from 50 to 1500 angstrom; and a thickness of the second silicon nitride dielectric layer is from 200 to 2000 angstrom.

17. The pixel of the uncooled infrared focal plane detector according to claim 9, wherein the third sacrificial layer is one of an amorphous carbon, an amorphous silicon, a silicon oxide and a polyimide; a thickness of the third sacrificial layer is from 0.5 to 3 μm; a thickness of the third support layer is from 0.05 to 0.30 μm; materials of the film at the absorption layer is one of graphene, carbon nanotube, titanium dioxide nanotube, zinc oxide nanotube and an alumina nanotube; and a thickness of the protection layer for the absorption layer is from 0.05 to 0.30 μm.

* * * * *